United States Patent [19]

Nakago

[11] Patent Number: 5,543,996
[45] Date of Patent: Aug. 6, 1996

[54] PROTECTIVE CIRCUIT FOR PROTECTING TRANSISTOR FROM THERMAL DESTRUCTION

[75] Inventor: Manabu Nakago, Tokyo, Japan

[73] Assignee: NEC Corporation, Tokyo, Japan

[21] Appl. No.: 363,832

[22] Filed: Dec. 27, 1994

[30] Foreign Application Priority Data

Dec. 28, 1993 [JP] Japan ..................................... 5-337167

[51] Int. Cl.$^6$ ................................................. H01L 29/00
[52] U.S. Cl. ............................ 361/90; 361/103; 361/115
[58] Field of Search ............................. 361/91, 103, 115, 361/90

[56] References Cited

U.S. PATENT DOCUMENTS 4,698,655 10/1987 Schultz .................................. 361/103

*Primary Examiner*—Jeffrey H. Gaffin
*Assistant Examiner*—Stephen W. Jackson
*Attorney, Agent, or Firm*—Whitham, Curtis, Whitham & McGinn

[57] ABSTRACT

An overheat protective circuit includes a first voltage generator generating a first voltage stabilized against a change of an operating temperature, a second voltage generator generating a second voltage changeable in accordance with a change of the operating temperature, a comparator having first and second inputs coupled to receive the first and second voltages, respectively, and a switching circuit responding to a first logic level of the output signal from the comparator to render a transistor to be protected non-conductive. This protective circuit further includes a control circuit which monitors a power voltage and controls, when the power voltage is in a predetermined range, the level at one of the first and second inputs of the comparator such that the comparator outputs its output signal having the second logic level to deactivate the switching circuit.

20 Claims, 8 Drawing Sheets

1

PROTECTIVE CIRCUIT FOR PROTECTING TRANSISTOR FROM THERMAL DESTRUCTION

BACKGROUND OF THE INVENTION

This invention relates to a power metal-oxide-semiconductor integrated circuit (MOS IC) and, more particularly, to a protective circuit employed in such an IC for protecting a power MOS transistor from thermal destruction.

Since a power MOS IC consumes a large power, it operates under a condition of a relatively high operating temperature. It is therfore required to protect the IC, a power transistor in particular, from a thermal destruction. For his purpose, the power MOS IC employs an overheat protective circuit for the power transistor.

Referring to FIG. 6, such a conventional overheat protective circuit comprises a first voltage line 50 receiving a power voltage Vcc, a reference voltage generator 2 generating and supplying on a voltage line 55 a reference voltage BGR2 stabilized against a change in an operating temperature, another reference voltage generator 1 connected between the first voltage line 50 and the second voltage line 55 and generating at its output node 60 a reference voltage BGR1 which is also stabilized against the operating temperature, a temperature detective circuit 3 connected between the first voltage line 50 and the second voltage line 55 and generating at its output node 65 a detection voltage OT which is changed in accordance with the operating temperature, and a comparator 4 comparing the reference voltage BGR 1 with the detection voltage OT. The output from the comparator 4 is supplied to the gate of a shunt MOS transistor 6 of an N-channel type connected between the gate and source of an N-channel output power MOS transistor 7 as a transistor to be protected. This transistor is connected between the first voltage line 50 and an output terminal OUT and driven by a drive circuit 5 such as a charge pump circuit.

The operation will be described below. When this circuit operates under a normal operating temperature, the detective circuit 3 produces such a detection voltage OT that has a level lower than that of the reference voltage BGR1. Accordingly, the comparator 4 outputs the low level to turn off the shunt MOS transistor 6. The output transistor 7 thereby responds to the signal from the drive circuit 5 to drive a load (not shown) connected to the output terminal OUT. The level of the detection voltage depends on the operating temperature. When the operating temperature reaches a predetermined temperature due to, for example a load short, the detection voltage OT exceeds the level of the reference voltage BGR1. The output voltage of the comparator 4 is thereby changed from the low level to the high level to turn the transistor 6 on. The current path between the gate and source of the output MOS transistor 7 is thus shunt to render the output MOS transistor 7 nonconductive irrespective of the drive signal from the driver circuit 5. In such a manner as described above, the output transistor 7 is protected from thermal destruction.

Turning to FIG. 8, the temperature detective circuit 3 is constructed by a resistor 31 connected between the first voltage line 50 and a first node, a resistor 32 connected between the first node and a second node, a bipolar transistor 33 connected between the first voltage line 50 and the second node and having a base connected to the first node, a plurality of diodes 34 connected in series between the second node and the output node 65, and a current source 35 connected between the output node 65 and the second voltage line 65. Since each diode has a negative temperature coefficient in a forward voltage thereof, the level of the detection voltage OT increases in accordance with the increase in operating temperature.

On the other hand, the reference voltage operator generator 1 is composed of the so-called band gap regulator. Since the band gap regulator is well known in the art, the circuit construction thereof will be omitted.

Under the condition of the typical level of the power supply voltage Vcc, the reference circuit 1 generates the reference voltage BGR1 having a preset level and the detective circuit 3 also generates the detection level having a preset level depending on the operating temperature; however, when the power supply voltage Vcc is lowered due to a heavy load or a change of a power source for generating the power voltage Vcc, each of the levels of the reference voltage BGR1 and the detection voltage OT is also lowered accordingly. In this case, if the lowering in level of the reference voltage BGR1 would be proportional to that in level of the reference voltage OT, the comparator would not produce an erroneous output signal. However, there is in fact no proportional relationship therebetween, as shown in FIG. 7. This is, the reference voltage BGR1 represents a linear change, whereas the detection voltage OT represents a non-linear change. This is based on the difference in circuit construction between the reference voltage circuit 1 and the detective circuit 3. For this reason, the level of the detection voltage OT exceeds that of the reference voltage BGR1 within a range "A" of the power voltage Vcc as indicated in FIG. 7. The comparator 4 thereby changes its output signal from the lower level to the high level within the range A of the power voltage Vcc irrespective of the fact that the operating temperature is below the designed value for protecting the output transistor 7. The transistor 6 is thereby rendered conductive to cause the output transistor 7 to stop driving the load. The error in circuit operation thus take place.

SUMMARY OF THE INVENTION

It is object of this invention to provide an improved overheat protective circuit.

It is another object of the present invention to provide a protection circuit free from a malfunction over a wide range of a power supply voltage.

A protective circuit according to the present invention includes a first voltage generator for generating a first voltage having a level which is stabilized against a change of an operating temperature, a second voltage generator for generating a second voltage having a level which is changeable with a change of the operating temperature, a control circuit coupled to one of the first and second voltage generators to forcibly change the level of one of the first and second voltages to a predetermined fixed level when a power supply voltage is in a predetermined range, and a comparator comparing the level of the first voltage with the level of the second voltage and producing a comparison output signal, and a switching element responding to the comparison output signal to control a transistor to be protected.

With the above construction, the level of one of the first and second voltages is clamped to the fixed voltage within the predetermined range of the power supply voltage. Accordingly, the comparator is prevented from producing an erroneous output signal even when the power supply voltage is lowered. The protective circuit is thus free from a muloperation.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
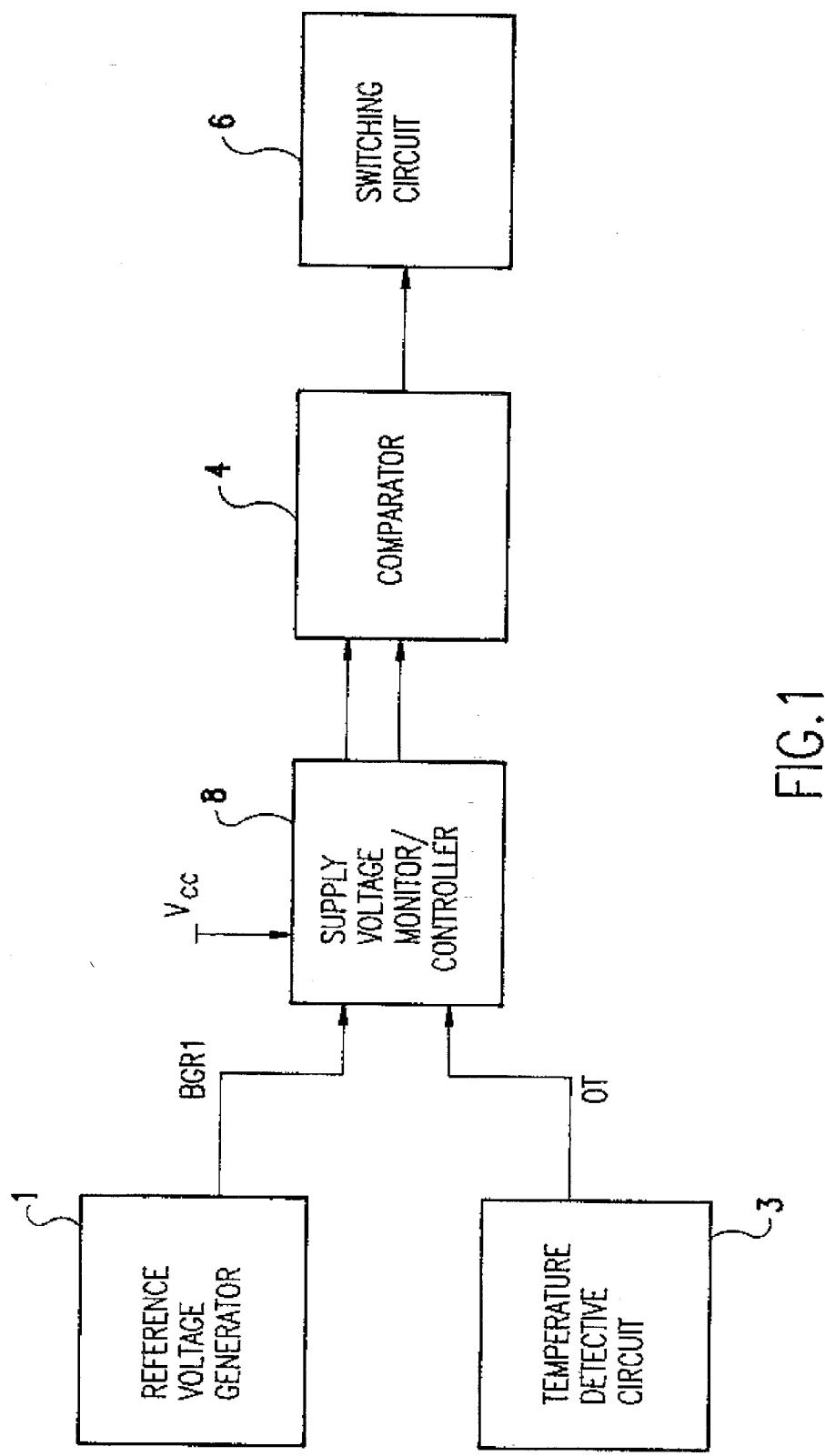
FIG. 1 is a block diagram for illustrating an overheat protective circuit according to the present invention.
Figure 6:
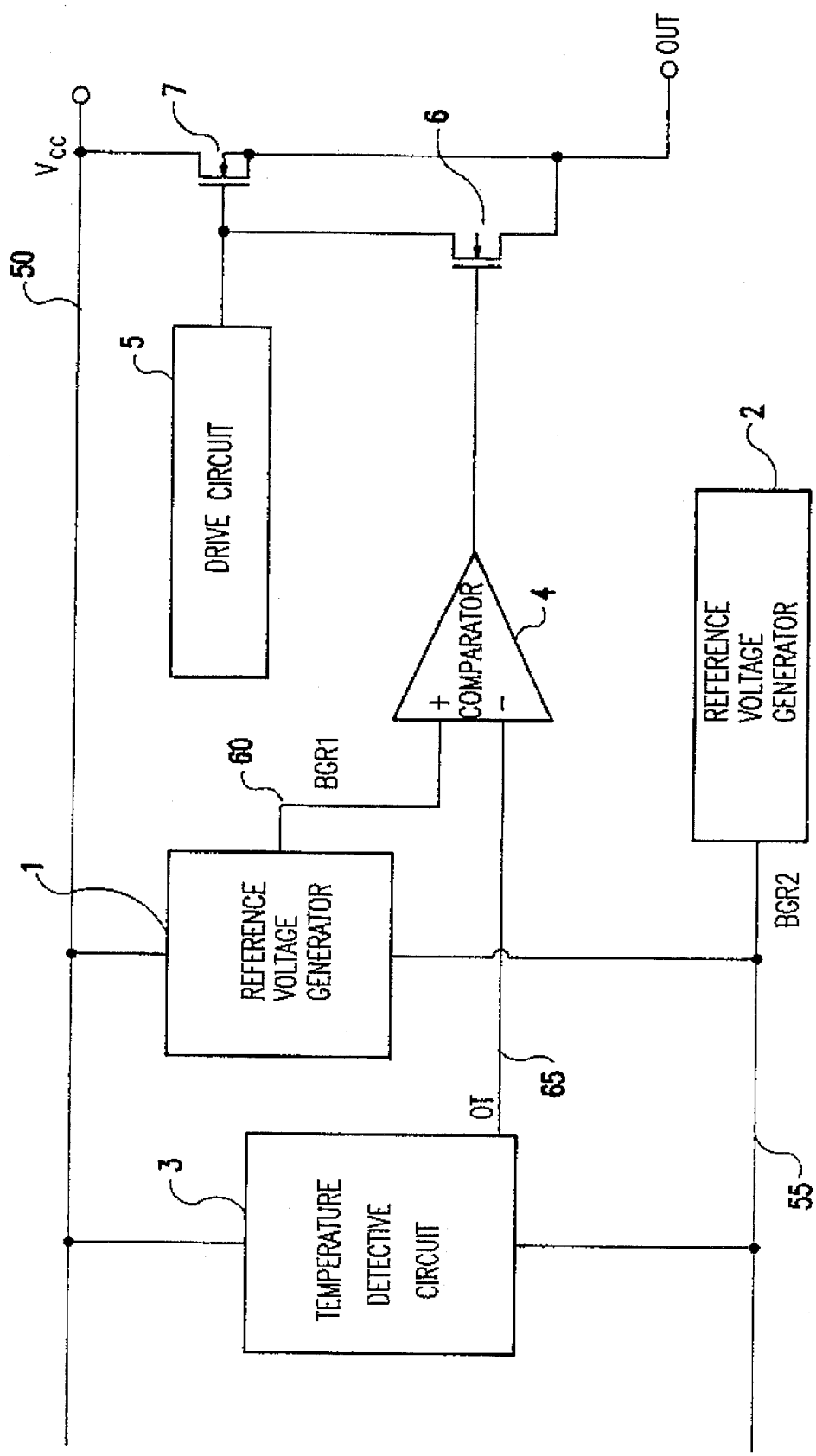
FIG. 6 is a block diagram of a conventional overheat protective circuit.
Figure 7:
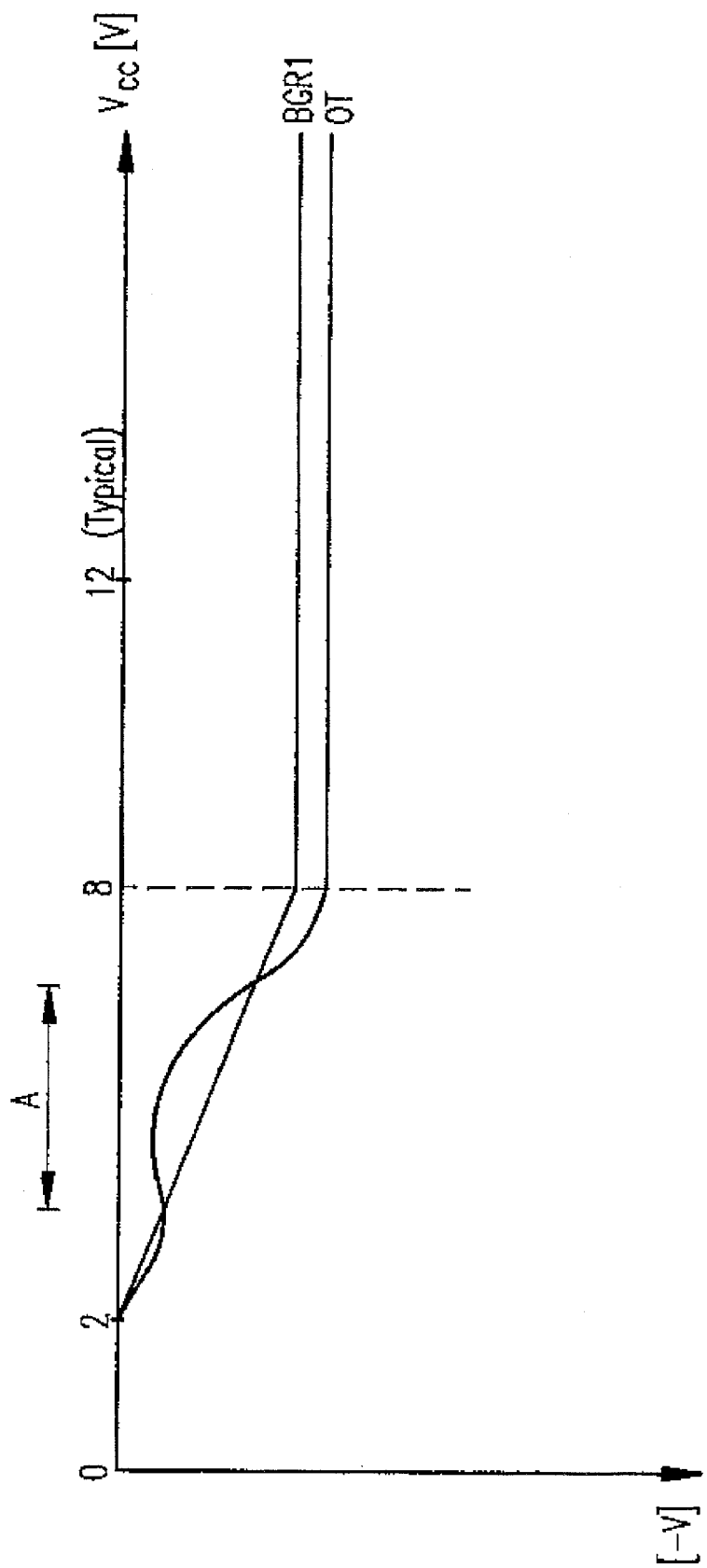
FIG. 7 is a voltage wave-form diagram showing changes in level of a reference voltage BGR1 and a detection voltage OT shown in FIG. 6.
Figure 8:
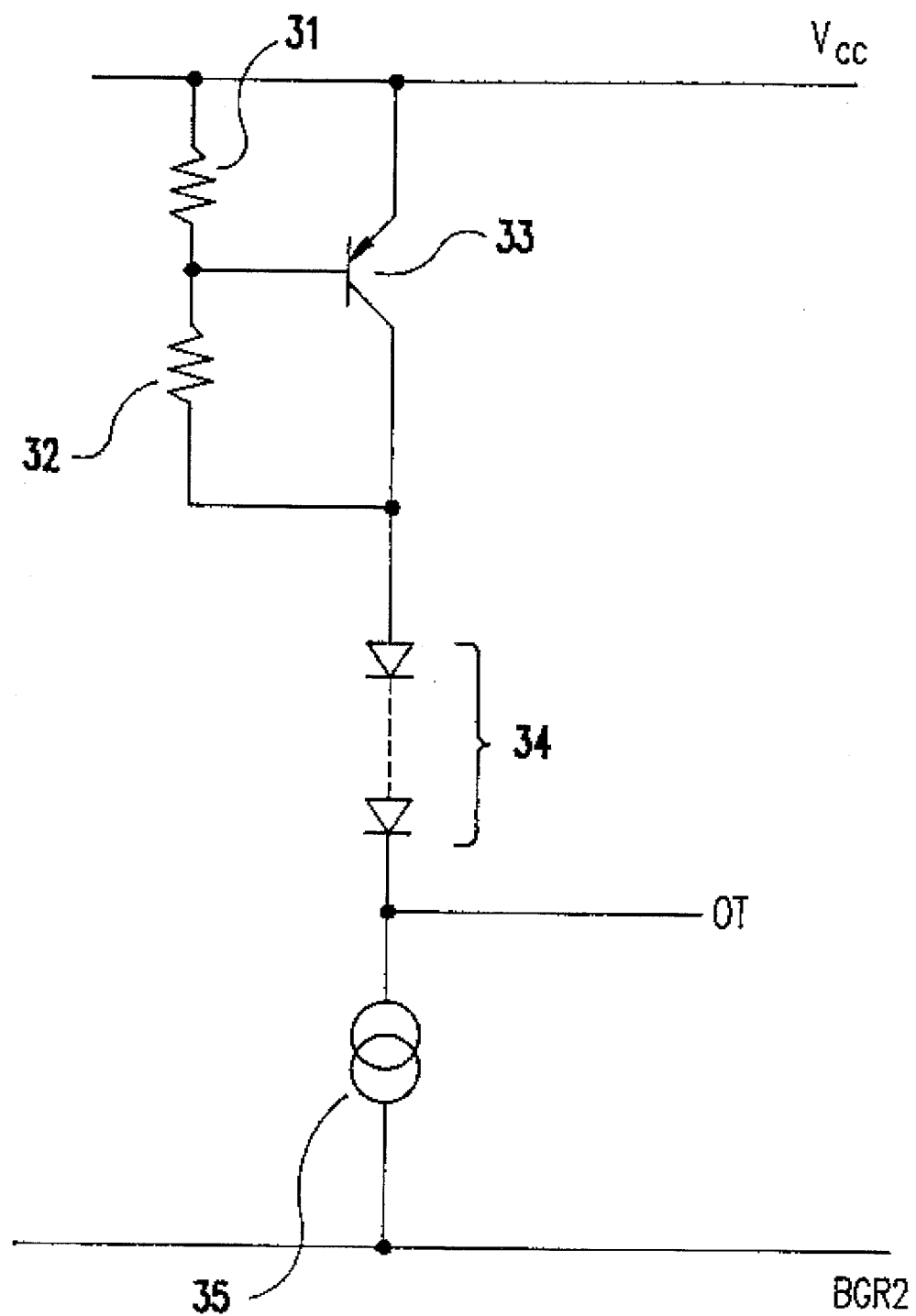
FIG. 8 is a circuit diagram showing a temperature detective circuit shown in FIGS. 2 and 6.

Referring now to FIG. 1, an overheat protective circuit according to the present invention includes, in addition to the reference voltage generator 1, the temperature detective circuit 3, the comparator 4 and the switching circuit 6 as shown in FIG. 6, a voltage monitor/control circuit 8. This circuit 8 receives the reference voltage BGR1 and the detection voltage OT and further monitors the power voltage Vcc to detect whether or not the level thereof is in a predetermined range. When the level of the power voltage Vcc is detected to be within the range, one of the reference voltage BGR1 and the detection voltage OT is clamped to a predetermined level that does not exceed the level of the other one. The reference voltage BGR1 (or the detection voltage OT) thus controlled is supplied to the comparator 4 together with the detection voltage OT (or the reference voltage BGR1).

Figure 2:
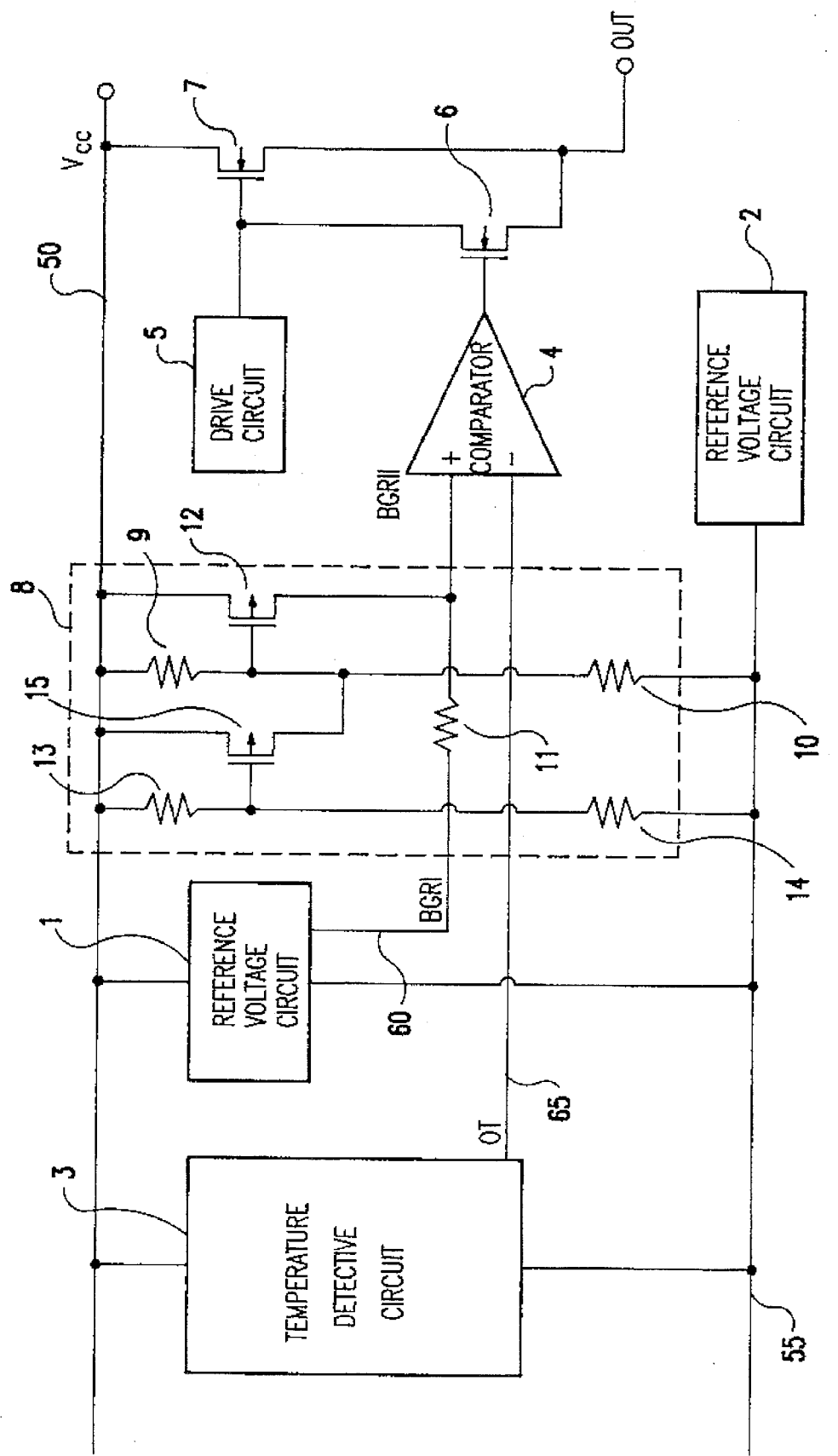
FIG. 2 is a block diagram showing an overheat protective circuit according to a first embodiment of the present invention.

Turning to FIG. 2, the monitor/control circuit 8 is provided to control the reference voltage BGR1. More specifically, the circuit 8 includes five resistors 9, 10, 11, 13 and 14 and two P-channel MOS transistors 12 and 15, which are connected as shown. The resistor 9 has a resistance value larger than that of the resistor 10, whereas the resistor 13 has a resistance value smaller than that of the resistor 14. Since the other circuit constituents are the same as those as shown in FIG. 6, they are denoted by the same reference numerals to omit the further description thereof. Further, the protecting operation of the case where the operating temperature exceeds a predetermined temperature is also the same as that is described with reference to FIG. 6, and hence will be omitted.

Figure 3:
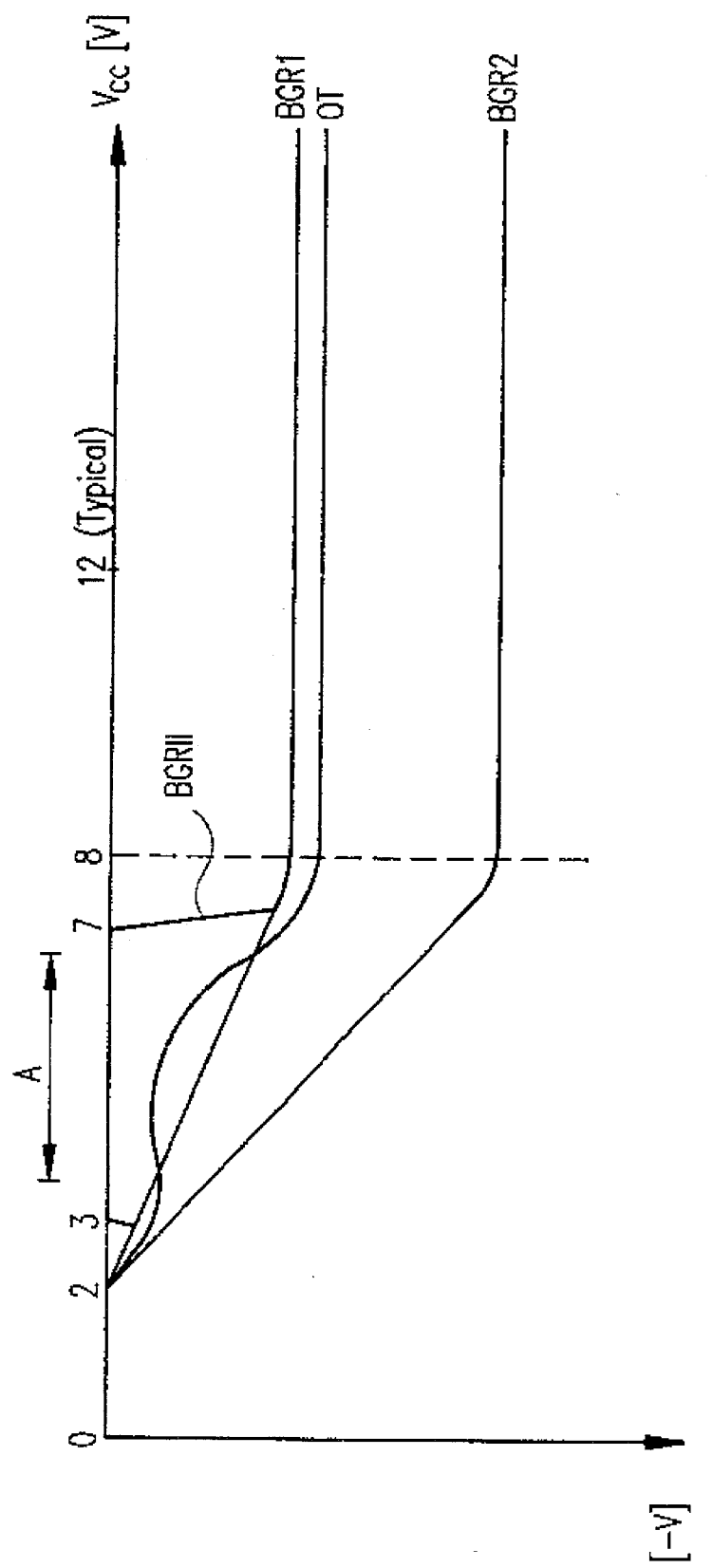
FIG. 3 is a voltage wave-form diagram showing changes in level of reference voltages BGR1 and BGR2 and a detection voltage OT shown in FIG. 2.

In the circuit thus constructed, when a power switch (not shown) is turned on, the power voltage Vcc is being raised from the zero level to the typical level (12 V, for example). As shown in FIG. 3, when the level of the power voltage Vcc reaches 2 V, each of the circuits 1, 2 and 3 starts operating to generate the respective output voltages BGR1, BGR2 and OT.

When the power voltage Vcc reaches 3 V, the transistor 12 is rendered conductive, whereas the transistor 15 is maintained in a non-conductive state due to the resistance values thereof as described above. The level of the voltage BGR11 actually supplied to the non-inverting input of the comparator 4 is thereby clamped to the level of the power voltage Vcc irrespective of the fact that the reference voltage BGR1 changes as shown in FIG. 3. When the level of the power voltage Vcc is further increased to reach 7 V, the transistor 15 is turned on to raise the gate level of the transistor 12. The transistor 12 is thereby rendered non-conductive. Accordingly, the voltage BGR11 is changed to have the level of the reference voltage BGR1, as shown in FIG. 3.

In the present embodiment, the level range of the power voltage Vcc in which the transistor 12 is maintained in the conductive state is designed to cover the level range "A" in which the level of the detection voltage OT exceeds the level of the reference voltage BGR 1 as mentioned before. Accordingly, the comparator 4 holds its output signal at the low level.

When the level of the power voltage Vcc reaches 8 V, the voltages BGR1, BGR 2 and OT takes the respective preset level, as shown in FIG. 3.

Thus, even if the power voltage Vcc is changed to have a level with the range A, the comparator 4 never outputs an error signal. This circuit is therefore free from a malfunction which would be otherwise unavoidable in the circuit as shown in FIG. 6.

Figure 4:
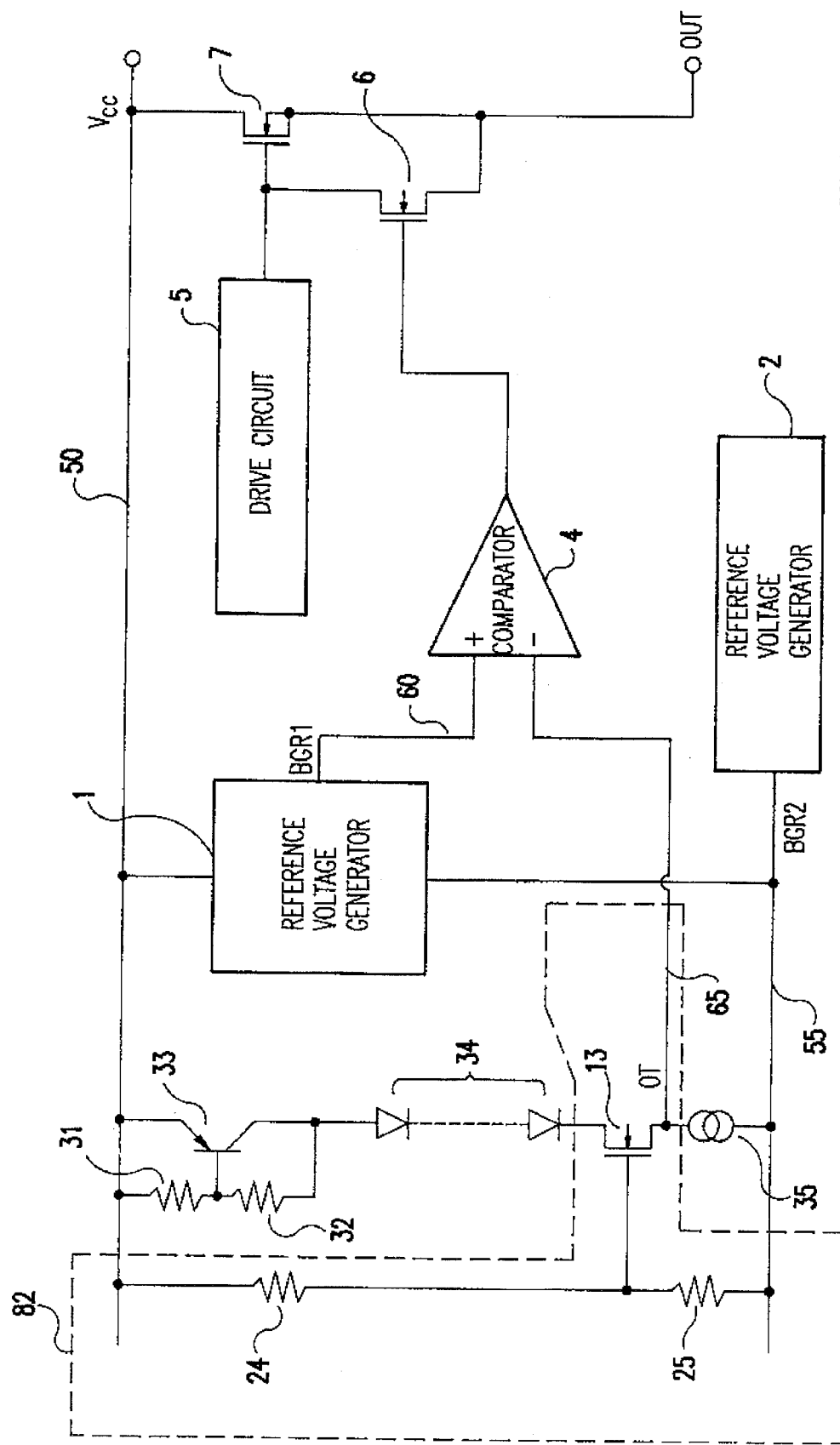
FIG. 4 is a block diagram showing an overheat protective circuit according to a second embodiment of the present invention.
Figure 5:
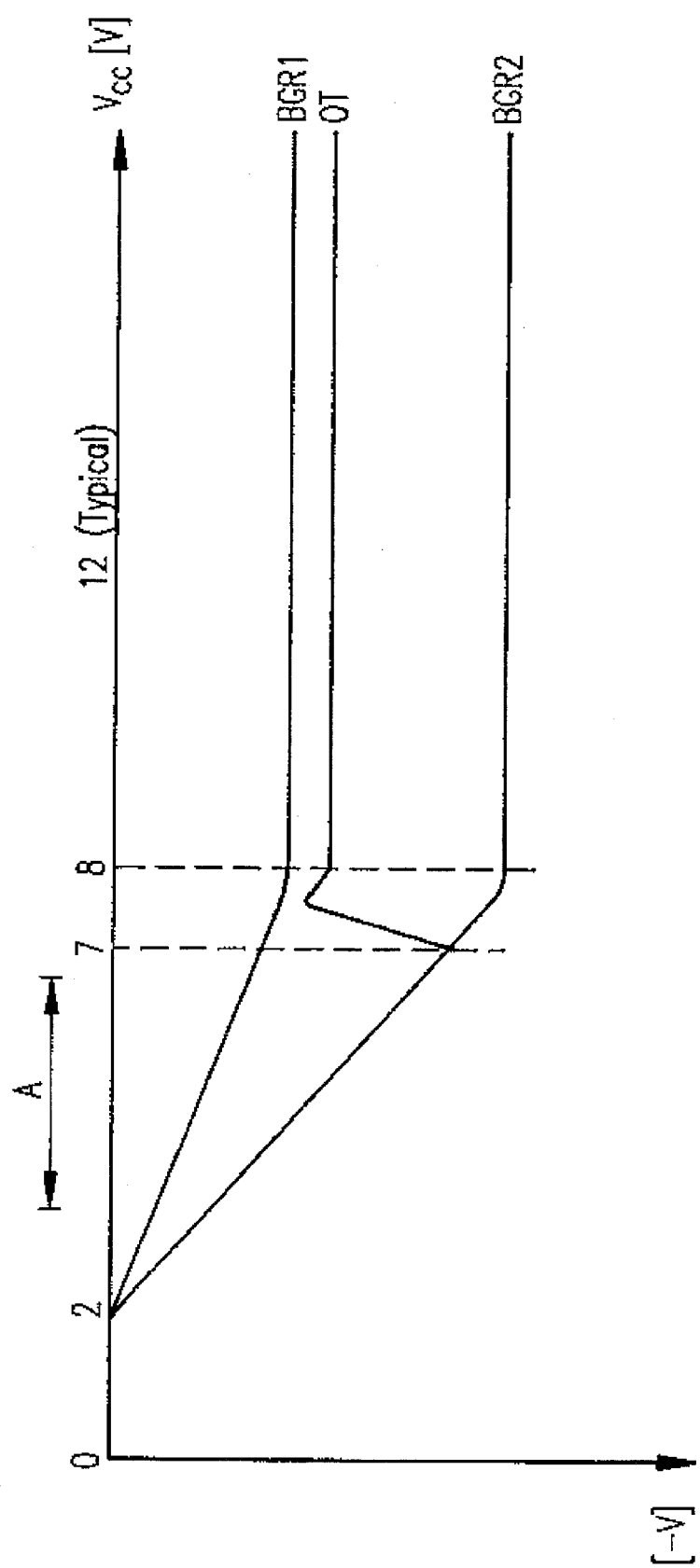
FIG. 5 is a voltage wave-form diagram showing changes in level of reference voltages BGR1 and BGR2 and the detection voltage OT shown in FIG. 4.

Referring to FIG. 4, the monitor/control circuit 8 is provided to control the detection voltage OT. More specifically, the circuit 8 includes an N-channel MOS transistor 13 connected between the series-connected diode 34 and the current generator 35 of the temperature detective circuit 3, a resistor 24 connected between the first voltage line 50 and the gate of the MOS transistor 13, and a resistor 25 connected between the second voltage line 55 and the gate of the transistor 13. The ratio in resistance value of the resistors 24 and 25 is designed such that the transistor 13 is kept non-conductive until the level of the power voltage Vcc reaches 7 V. Accordingly, the level of the detection voltage OT takes the same level of the voltage on the line 55 until the level of the power voltage Vcc reaches 7 V, as shown in FIG. 5. As a result, even when the power voltage Vcc is changed to take a level within the range A, the comparator 4 holds its output signal at the low level.

Also in this embodiment, therefore, the same effect as the circuit shown in FIG. 2 is derived.

As described above, in the overheat protective circuit of the present invention, the output voltage OT or the reference voltage BGR1 is controlled by the voltage monitor/control circuit when the power voltage Vcc is low, especially during the rise time thereof, of the comparator never outputs an error signal.

It are apparent that the above specific embodiments is not meant to be construed as limiting the present invention. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A protective circuit for protecting a transistor, comprising:

a first voltage generator, connected between a first voltage line and a second voltage line, for generating a first voltage having a level which is stabilized against a change of an operating temperature;

a second voltage generator, connected between said first voltage line and said second voltage line, for generating a second voltage having a level which is changeable in accordance with a change of said operating temperature;

a comparator having first and second inputs;

means for supplying said first and second voltages to said first and second inputs of said comparator, respectively; and a control circuit coupled between said first voltage line and said second voltage line for forcibly changing a level at one of said first and second inputs of said comparator to a predetermined level when a power voltage between said first and second voltage lines is in a predetermined range, wherein said predetermined range corresponds to a range in which said second voltage has a substantially nonlinear characteristic.

2. The circuit as claimed in claim 1, further comprising a switching circuit for responding to an output signal of said comparator and for rendering said transistor nonconductive when said output signal takes one of a first logic level and a second logic level, said predetermined level being such that said comparator produces the output signal taking the other of said first and second logic levels when said power voltage is in said predetermined range.

3. The circuit as claimed in claim 1, wherein, when a power voltage between said first and second voltage lines is outside said predetermined range, said control circuit is non-operational such that a level of said first input and a level of said second input of said comparator are unchanged.

4. The semiconductor device as claimed in claim 1, wherein said first voltage represents a first positive voltage and said second voltage represents a second positive voltage.

5. The circuit as claimed in claim 1, wherein said predetermined level is substantially equal to a voltage level of said first voltage line.

6. The circuit as claimed in claim 5, wherein said control circuit includes a switch connected between said first voltage line and said first input of said comparator and means for turning said switch on when said power voltage is in said predetermined range.

7. The circuit as claimed in claim 1, wherein said predetermined level is substantially equal to a voltage level of said second voltage line.

8. The circuit as claimed in claim 7, wherein said control circuit includes means for connecting said second input of said comparator to said second voltage line when said power voltage is in said predetermined range.

9. A semiconductor device, comprising a first voltage generator, connected between a first voltage line and a second voltage line, for outputting a first voltage to a first node, said first voltage having a level which is stabilized against a change of an operating temperature;

a second voltage generator, connected between said first voltage line and said second voltage line, for outputting a second voltage to a second node, said second voltage having a level which is changeable in accordance with a change of said operating temperature;

a comparator having a first input connected to said first node and a second input connected to said second node for comparing said first voltage with said second voltage;

a control circuit, connected between said first voltage line and said second voltage line and connected to said first node, for biasing said first node when a power voltage between said first and second voltage lines is lower than a predetermined voltage, said first node being unbiased by said control circuit when a power voltage between said first and second voltage line is higher than said predetermined voltage, wherein said second voltage has a substantially nonlinear characteristic within a predetermined range, said predetermined voltage being an upper limit of said predetermined range.

10. The semiconductor device as claimed in claim 9, wherein said control circuit includes a first transistor connected between said first voltage line and a gate connected to a third node.

11. The semiconductor device as claimed in claim 10, wherein said control circuit further includes a first resistor element connected between said first voltage line and said third node and a second resistor element connected between said third node and said second voltage line.

12. The semiconductor device as claimed in claim 11, wherein said control circuit further includes a second transistor connected between said first voltage line and said third node and a gate connected to a fourth node.

13. The semiconductor device as claimed in claim 12, wherein said control circuit further includes a third resistor element connected between said first voltage line and said fourth node.

14. The semiconductor device as claimed in claim 13, wherein said control circuit further includes a fourth resistor element connected between said fourth nodes and said second voltage line.

15. A semiconductor device, comprising:

a first voltage generator, connected between a first voltage line and a second voltage line, for outputting a first voltage to a first node, said first voltage having a level which is stabilized against a change of an operating temperature;

a second voltage generator, connected between said first voltage line and said second voltage line, for outputting a second voltage to a second node, said second voltage having a level which is changeable in accordance with a change of said operating temperature;

a comparator having a first input connected to said first node and a second input, connected to said second node, for comparing said first voltage with said second voltage;

a control circuit, connected between said first voltage line and said second voltage line and connected to said second node, for biasing said second node when a power voltage between said first and second voltage lines is lower than a predetermined voltage, said second node being unbiased by said control circuit when a power voltage between said first and second voltage line is higher than said predetermined voltage, wherein said second voltage has a substantially nonlinear characteristic within a predetermined range, said predetermined voltage being an upper limit of said predetermined range.

16. The semiconductor device as claimed in claim 15, wherein said second reference voltage generator includes a first resistor element connected between said first voltage line and a third node, and a second resistor element connected between said third node and fourth node.

17. The semiconductor device as claimed in claim 16, wherein said second reference voltage generator further includes a transistor connected between said first voltage line and said fourth node and a base connected to said third node, a diode element connected between said fourth node and a fifth node, and a current generator connected between said second voltage line and a sixth node.

18. The semiconductor device as claimed in claim 17, wherein said fifth node and said sixth node are connected together via said second reference voltage generator.

19. The semiconductor device as claimed in claim 17, wherein said control circuit includes a third resistor element connected between said first voltage line and a seventh node.

20. The semiconductor device as claimed in claim 19, wherein said control circuit further includes a fourth resistor element connected between said second voltage line and said seventh node, and wherein said control circuit further includes a second transistor connected between said fifth node and said sixth node and a gate connected to said seventh node.

* * * * *